United States Patent
Shih et al.

(10) Patent No.: US 6,268,281 B1
(45) Date of Patent: Jul. 31, 2001

(54) METHOD TO FORM SELF-ALIGNED CONTACTS WITH POLYSILICON PLUGS

(75) Inventors: Cheng-Yeh Shih, Hsin-Chu; Chung-Long Chang, Dou-Liu; Jin-Yuan Lee, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/439,362

(22) Filed: Nov. 15, 1999

(51) Int. Cl.[7] ............................................. H01L 21/4763
(52) U.S. Cl. ................... 438/629; 438/631; 438/647; 438/672; 438/238
(58) Field of Search ..................... 438/238, 253–256, 438/393–399, 618–677

(56) References Cited

U.S. PATENT DOCUMENTS

| | | | |
|---|---|---|---|
| 5,229,326 | 7/1993 | Dennison et al. | 437/195 |
| 5,723,381 | 3/1998 | Grewal et al. | 438/633 |
| 5,747,382 | 5/1998 | Huang et al. | 438/624 |
| 5,748,521 | * 5/1998 | Lee | 365/149 |
| 5,792,684 | 8/1998 | Lee et al. | 438/238 |
| 6,107,193 | * 8/2000 | Shiao et al. | 438/648 |
| 6,150,183 | * 11/2000 | Fukuda et al. | 438/3 |

* cited by examiner

*Primary Examiner*—Jey Tsai
(74) *Attorney, Agent, or Firm*—George O. Saile; Stephen B. Ackerman; Rosemary L. S. Pike

(57) ABSTRACT

An improved method to form self-aligned contacts with polysilicon plugs is described. A semiconductor substrate is provided. A silicon oxide layer overlying the semiconductor substrate is deposited. A contact hole is etched through the silicon oxide layer to the surface of the semiconductor substrate. A polysilicon layer is deposited overlying the silicon oxide layer and filling completely the contact hole. The polysilicon layer is polished away to define only polysilicon remaining in the contact hole and to remove the silicon oxide layer sufficient to flatten the top surface of the silicon oxide layer. The fabrication of the integrated circuit device is completed.

17 Claims, 3 Drawing Sheets

METHOD TO FORM SELF-ALIGNED CONTACTS WITH POLYSILICON PLUGS

BACKGROUND OF THE INVENTION

1. Field of the Invention

The invention relates to a method of fabricating semiconductor structures, and more particularly, to the formation of polysilicon plugs for DRAM memory cells.

2. Description of the Prior Art

As semiconductor memory devices continue to be scaled down, it is increasingly difficult to provide connectivity between devices while not sacrificing the improved packing density of the latest technology. Typically in the art, adjacent dynamic random access memory, or DRAM word lines are spaced very closely together. To construct a viable circuit, a connection must be made from the substrate active area between two adjacent word lines up to the metal interconnecting layers above the word lines. Unfortunately, the current technology is not capable of making such a contact opening at the small spacing of the word lines.

To overcome this problem, the approach of the prior art is to create a self-aligned contact, or SAC, structure. The key techniques in making the SAC are the use of material selective etches and protective films to advantageously cover the word lines from the selective etches. For instance, if a thick silicon oxide interlevel isolation must be etched to create the contact opening, then a thin layer of silicon nitride film might be used to cover the word line. In this case, a selective etch that attacks silicon oxide rapidly but silicon nitride very slowly could be used. Once the contact opening is etched, the silicon nitride protective layer would be carefully removed to complete the contact opening to the substrate. Once the contact opening is made, typically a polysilicon layer is deposited to fill the contact opening. Often, a polishing step is then used to etch down this polysilicon layer until only a plug of polysilicon remains to fill the contact opening. In this way a contact opening that is larger than the available word line space can be used in the connection from substrate to interconnect level.

A particular step in the formation of the SAC polysilicon plug for a DRAM in the prior art is shown in FIG. 1. A silicon substrate 11 is provided. Not shown in this illustration are the features below the surface of the substrate 11 such as shallow trench isolation structures and the source and drains of the active devices.

At the surface of the substrate 11, two DRAM word lines are shown. These word lines are constructed as a stack of gate silicon oxide 12, polysilicon gate 13, and capping silicon nitride 14. Sidewall spacers 15 of silicon nitride are also provided overlying the word lines and the substrate 11 surface adjacent the word lines is a layer of pad silicon oxide 16. A layer of interpoly oxide 17, or IPO, is shown after deposition.

In the typical prior art, at this point the wafer is subjected to a chemical mechanical polishing, or CMP, step to planarize the IPO layer 17. After CMP, a photoresist layer 18 is deposited and patterned using photolithography as shown in FIG. 2. The photoresist pattern opening determines the location of the SAC hole. Note how this opening is substantially wider than the potential substrate 11 contact width between the sidewall spacers 15 of the two word lines.

After the photoresist 18 is patterned, the SAC hole is etched. As shown in FIG. 3, a thin, high temperature film, or HTF, of doped polysilicon 19 is deposited overlying the entire exposed surface. Next, a thick layer of doped polysilicon 20 is deposited overlying the HTF polysilicon 19. The polysilicon surface layer 20 is now subjected to a CMP process. As shown in FIG. 4, the polysilicon layers 19 and 20 are polished down to the surface of the IPO layer 17. This completes the formation of the polysilicon plug in the SAC hole.

Notice that this prior art sequence requires two different CMP steps to complete. Further, in the art it is common to have different CMP slurry compositions for polysilicon and silicon oxide. Further yet, by subjecting the IPO layer to CMP before the SAC etch step, additional wafer to wafer variation is introduced in the thickness of IPO that must be etched in the SAC etch step.

Several prior art approaches deal with CMP processes to planarize the IPO layer. U.S. Pat. No. 5,792,684 to Lee et al shows an IPO planarization process. U.S. Pat. No. 5,747,382 to Huang et al discloses a two-step planarization process using CMP and reactive ion etching. U.S. Pat. No. 5,723,381 to Grewal et al teaches a SAC and IPO CMP process. U.S. Pat. No. 5,229,326 to Dennison shows a planarization process.

SUMMARY OF THE INVENTION

A principal object of the present invention is to provide an effective and very manufacturable method of fabricating self-aligned contacts with polysilicon plugs.

A further object of the present invention is to provide a manufacturing method that reduces the number of chemical mechanical polishes required to form the self-aligned contacts with polysilicon plugs.

Yet a further object of the present invention is to provide a manufacturing method that reduces variation in the self-aligned contact etch process.

In accordance with the objects of this invention, a new method of fabricating the self-aligned contact with polysilicon plug has been achieved. This method eliminates one chemical mechanical polish step and reduces variation in the self-aligned contact etch. A semiconductor substrate is provided. Sub-surface features, such as shallow trench isolations, device sources, and device drains, are provided in the substrate. On the surface of the substrate, DRAM word lines are provided. These word lines are constructed as a stack of gate silicon oxide, polysilicon gate, and capping silicon nitride. Sidewall spacers of silicon nitride are also provided. A layer of pad oxide is deposited overlying the word lines and the substrate surface. A layer of interpoly oxide is deposited overlying the pad oxide. A photo resist layer is deposited overlying the interpoly oxide layer and is patterned using photolithography to define the self-aligned contact openings. The self-aligned contact opening is etched through the interpoly oxide and the pad oxide to the substrate surface. A thin layer of polysilicon is deposited overlying the interpoly oxide and the inner surface of the self-aligned contact hole. A plug layer of polysilicon is deposited overlying the thin polysilicon. The plug polysilicon layer, the thin polysilicon layer, and the interpoly oxide layer are polished down to define the plug and to flatten the surface topology. This completes the formation of self-aligned contact with polysilicon plug in the fabrication of the integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
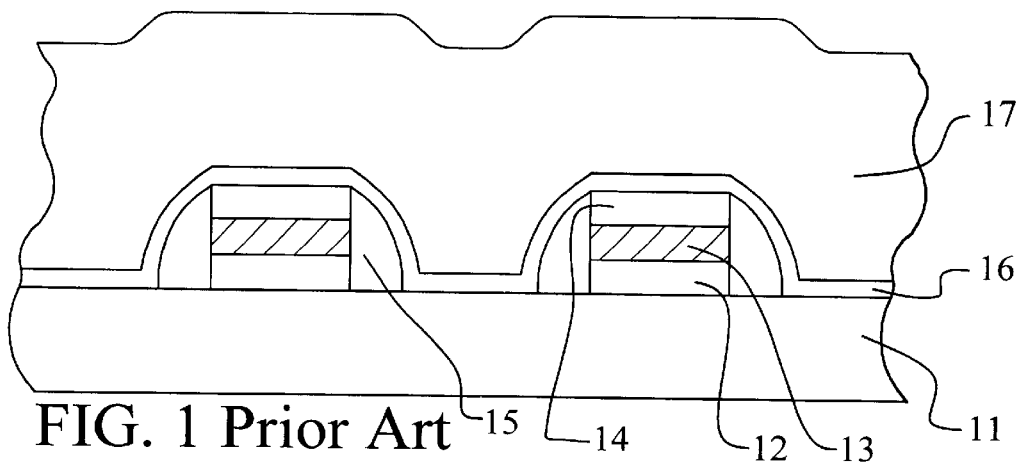
FIGS. 1 through 4 schematically illustrate in cross-section partially completed DRAM structures demonstrating the prior art sequence for forming self-aligned contacts with polysilicon plugs.
Figure 2:
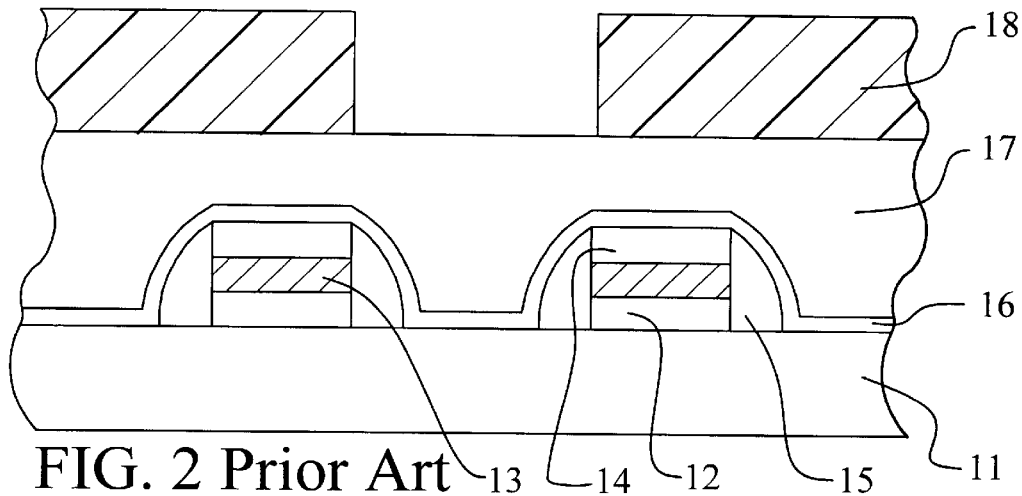
Figure 3:
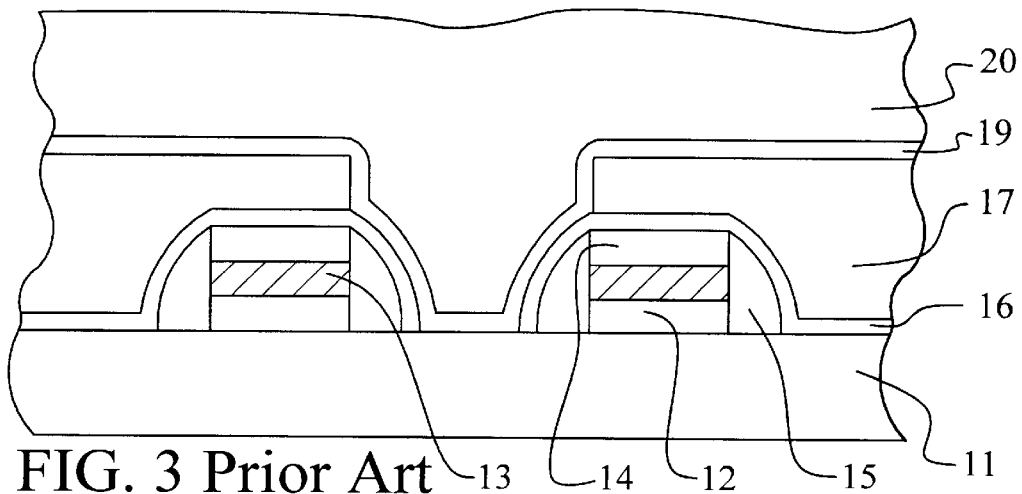
Figure 4:
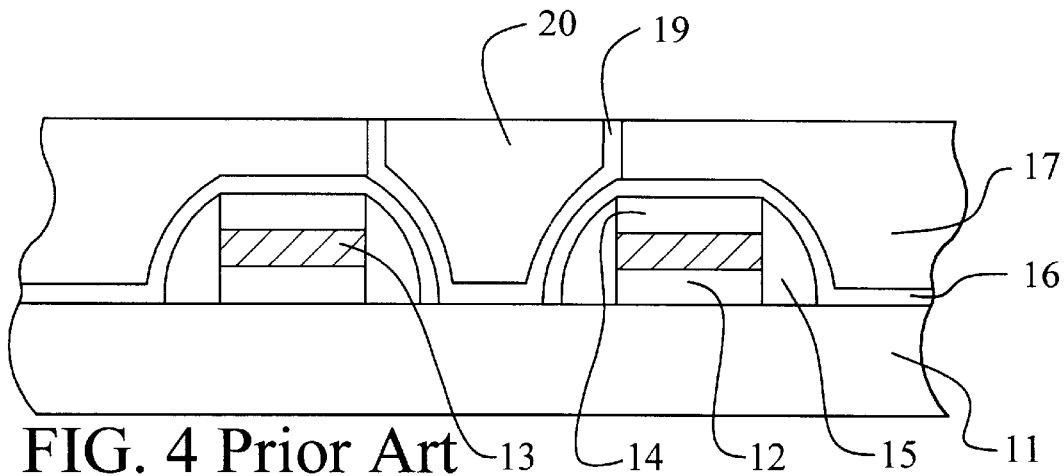
Figure 5:
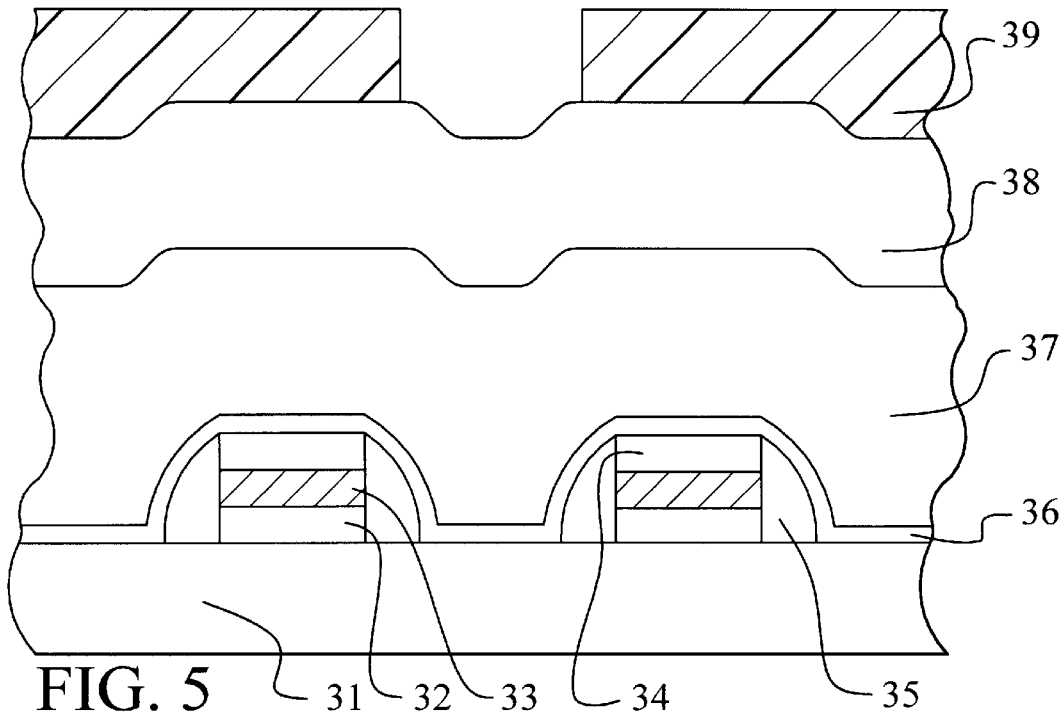
FIGS. 5 through 7 schematically illustrate in cross-sectional representation a preferred embodiment of the present invention.

Referring now more particularly to FIG. 5, there is illustrated a portion of a partially completed DRAM structure. Semiconductor substrate 31 is preferably composed of monocrystalline silicon. Subsurface details such as shallow trench isolation, gate electrodes and associated source and drain regions and overlying dielectric are not shown but are assumed to have been formed in and on the substrate 31 by methods common to the art. Word lines overlying the substrate 31 are preferably composed of a patterned stack made of a capping silicon nitride layer 34 overlying a polysilicon gate layer 33 overlying a silicon gate oxide layer 32, though other materials and methods common to the art could be used. Sidewall spacers 35 are preferably composed of silicon nitride.

The first layer of an interpoly oxide, or IPO, laminate is deposited. A thin layer of undoped silicate glass layer 36, or HUSG, is deposited overlying the substrate 31, the sidewall spacers 35, and the capping oxide 34 to a thickness of between about 500 Angstroms and 1,500 Angstroms. The HUSG layer 36 is used as a moisture stopping layer to prevent moisture out-diffusion from the subsequently deposited $O_3$-TEOS material.

A second layer of the IPO laminate layer, called ozone-tetraethoxysilane, or $O_3$-TEOS, layer 37, is deposited overlying the HUSG layer 36 to thickness of between about 2,000 Angstroms and 5,000 Angstroms. The $O_3$-TEOS layer 37 is an excellent gap-filling material.

The third and final layer in the IPO laminate, a TEOS layer 38 deposited by plasma-enhanced chemical vapor deposition, or PE-TEOS, is deposited overlying the $O_3$-TEOS layer 37 to a thickness of between about 4,000 and 7,000 Angstroms. The PE-TEOS layer 38 is for the chemical mechanical planarization and for capping the $O_3$-TEOS layer 37.

Other materials could be used in the formation of the interpoly oxide laminate, such as high density plasma undoped silicate glass (HDP USG) and high density plasma phosphosilicate glass (HDP PSG). The method used for forming the IPO laminate reduces the CMP process from two steps down to one step.

A layer of photoresist 39 is deposited overlying the PE-TEOS layer 38. The photoresist layer 39 is patterned using common photolithographic techniques to form openings where the SAC hole is to be etched.

Figure 6:
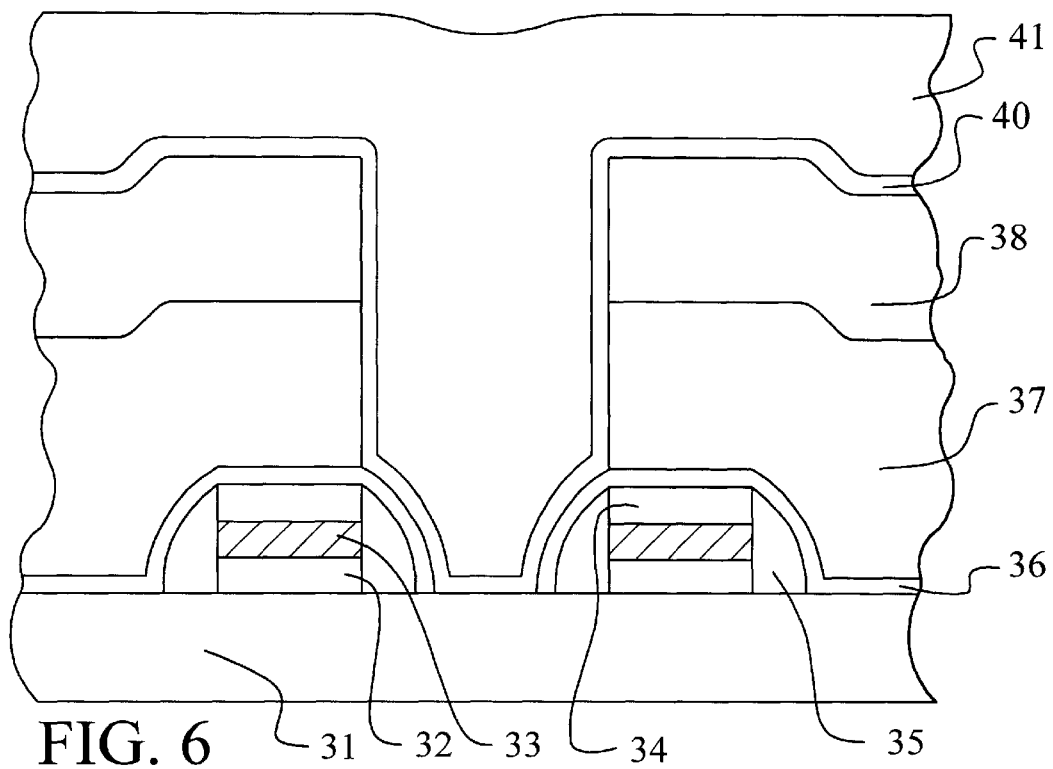

Referring now to FIG. 6, the SAC hole is etched through the IPO layers 39, 38, and 37 as conventional in the art. The etching step has a high selectivity to $Si_3N_4$ and stops at the $Si_3N_4$ layer.

Now a thin, high temperature film of doped polysilicon 40 is deposited overlying the PE-TEOS layer 39 and the inner surface of the SAC Hole to a thickness of between about 300 Angstroms and 1,000 Angstroms.

A thicker layer of doped polysilicon 41 is deposited overlying the high temperature polysilicon 40 to a thickness of between about 3,000 Agstroms and 5,000 Angstroms. This layer 41 will become the polysilicon plug.

Finally, a chemical mechanical polishing, or CMP, step is performed. This is a key feature of the preferred embodiment. The CMP material is preferably a slurry composed of either a silica abrasive in a KOH chemical base (such as Cabot SS-25) or a $CeO_2$ abrasive in a KOH chemical base (such as Hitachi HS-8005 with HS-8102 GP additive).

This type of slurry, which is normally used for polishing down silicon oxide, will polish down both the polysilicon layers 41 and 40 and the PE-TEOS oxide layer 38. This step is timed to between about 50 seconds and 120 seconds to remove all of the unwanted polysilicon from layers 41 and 40 and to flatten the top surface of the PE-TEOS oxide layer 38. The polysilicon removal rate is between about 5,000 Angstroms/minute and 7,000 Angstroms/minute. The PE-TEOS removal rate is between about 1,500 Angstroms/minute and 2,500 Angstroms/minute.

Figure 7:
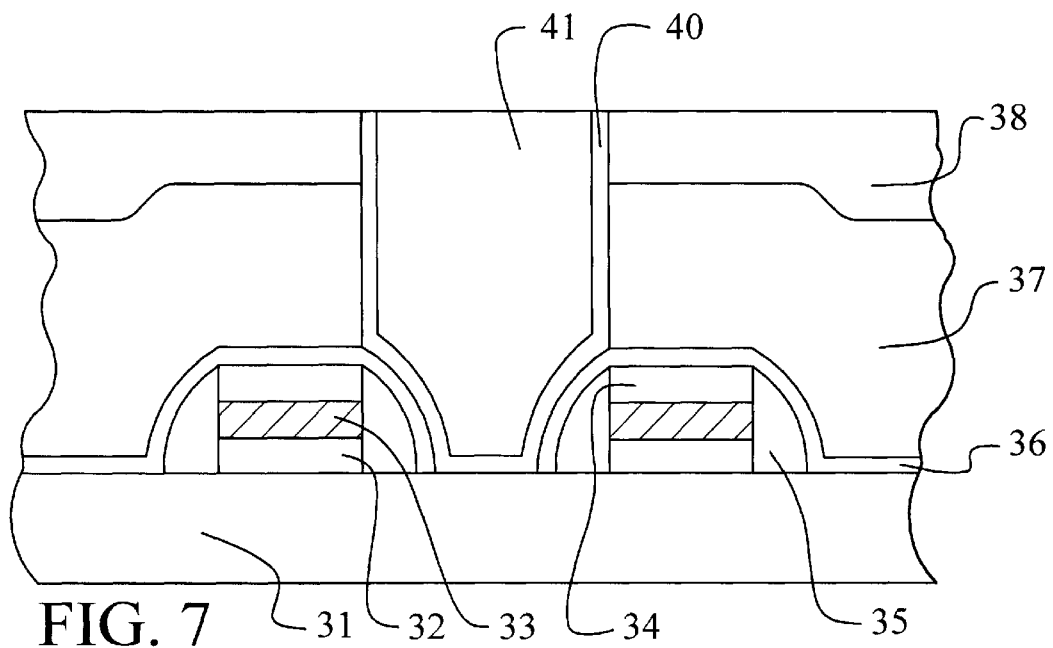

Referring now to FIG. 7, the finished SAC with polysilicon plug structure is illustrated.

It can now be demonstrated how the method features positively impact the manufacturability of the SAC with polysilicon plug structure. First, because the method eliminates a CMP step, it is less expensive and time consuming to produce than the prior art method. Further, since different chemical-mechanical compositions are normally used for polysilicon and silicon oxide polishing, the method reduces the need to have the additional slurry compound. Therefore, additional money is saved in material inventory and, possibly, equipment. Further yet, by not performing the CMP on the IPO layer prior to the photoresist application, the method actually provides better control of the SAC etch. This is because the variation of pre-etch thickness of the IPO is less in the new method. By using a one-step CMP process, the etch down uniformity is better when compared to a multiple CMP process.

The process of the present invention provides a very manufacturable process for forming self-aligned contacts with polysilicon plugs.

While the invention has been particularly shown and described with reference to the preferred embodiments thereof, it will be understood by those skilled in the art that various changes in form and details may be made without departing from the spirit and scope of the invention.

What is claimed is:

1. A method of fabrication of an integrated circuit device comprising:

providing a semiconductor substrate;

depositing an interpoly oxide laminated layer overlying said semiconductor substrate wherein said interpoly oxide laminated layer comprises a first layer, a second layer, and a third layer and wherein said first layer, said second layer, and said third layer are not planarized after said depositing;

etching a contact hole through said interpoly oxide laminated layer to the surface of said semiconductor substrate;

depositing a polysilicon layer overlying said interpoly oxide laminated layer and completely filling said contact hole;

polishing away said polysilicon layer to define only polysilicon remaining in said contact hole and thereby also polishing said interpoly oxide laminated layer sufficiently to flatten the top surface of said interpoly oxide laminated layer; and completing said fabrication of said integrated circuit device.

2. The method according to claim 1 wherein said first layer comprises HUSG having a thickness of between about 500 Angstroms and 1,500 Angstroms, said second layer comprises $O_3$-TEOS having a thickness of between about 2,000 Angstrom and 5,000 Angstroms, and said third layer comprises PE-TEOS having a thickness of between about 4,000 Angstroms and 7,000 Angstroms.

3. The method according to claim 1 wherein said polysilicon layer is comprised of more than one layer of material.

4. The method according to claim 1 wherein said polysilicon layer comprises:

a first layer of high temperature doped polysilicon film having a thickness of between about 300 Angstroms and 1,000 Angstroms; and a second layer of doped polysilicon having a thickness of between about 3,000 Angstroms and 5,000 Angstroms.

5. The method according to claim 1 wherein said polishing away of said polysilicon layer and said interpoly oxide laminated layer is by chemical mechanical polishing.

6. The method according to claim 1 wherein said chemical mechanical polishing material is a slurry composed of one of the group of: silica abrasive in a KOH chemical base and a $CeO_2$ abrasive in a KOH chemical base with a polishing time of between about 50 seconds and 120 seconds.

7. A method of fabrication of a self-aligning contact with polysilicon plug comprising:

providing semiconductor device structures in and on a semiconductor substrate wherein said semiconductor device structures include MOS transistor gates having silicon nitride sidewalls and wherein a contact node is formed in said semiconductor substrate between two of said MOS transistor gates;

depositing an interpoly oxide laminated layer overlying said semiconductor device structures wherein said interpoly oxide laminated layer comprises a first layer, a second layer, and a third layer and wherein said first layer, said second layer, and said third layer are not planarized after said depositing;

etching a contact hole through said interpoly oxide laminated layer to said contact node;

depositing a polysilicon layer overlying said interpoly oxide laminated layer and completely filling said contact hole;

polishing away said polysilicon layer to define only polysilicon remaining in said contact hole and thereby also polishing said interpoly oxide laminated layer sufficiently to flatten the top surface of said interpoly oxide laminated layer; and completing said fabrication of self-aligning contact with polysilicon plug device.

8. The method according to claim 7 wherein said first layer comprises HUSG having a thickness of between about 500 Angstroms and 1,500 Angstroms, said second layer comprises $O_3$-TEOS having a thickness of between about 2,000 Angstroms and 5,000 Angstroms, and said third layer comprises PE-TEOS having a thickness of between about 4,000 Angstroms and 7,000 Angstroms.

9. The method according to claim 7 wherein said polysilicon layer is comprised of more than one layer of material.

10. The method according to claim 7 wherein said polysilicon layer comprises:

a first layer of high temperature doped polysilicon film having a thickness of between about 300 Angstroms and 1,000 Angstroms; and a second layer of doped polysilicon having a thickness of between about 3,000 Angstroms and 5,000 Angstroms.

11. The method according to claim 7 wherein said polishing away of said polysilicon layer and said interpoly oxide laminated layer is by chemical mechanical polishing.

12. The method according to claim 7 wherein said chemical mechanical polishing material is a slurry composed of one of the group of: silica abrasive in a KOH chemical base and a $CeO_2$ abrasive in a KOH chemical base with a polishing time of between about 50 seconds and 120 seconds.

13. A method of fabrication of a self-aligning contact with polysilicon plug for a DRAM cell comprising:

providing a semiconductor substrate;

providing isolation devices in said substrate;

providing source and drain regions in said substrate;

providing DRAM word lines comprising gate silicon oxide layer overlying said substrate, gate polysilicon layer overlying said gate silicon oxide layer, capping silicon nitride layer overlying said gate polysilicon layer, and silicon nitride sidewall spacers covering the vertical sides formed by the stacking of said gate silicon oxide layer, said gate polysilicon layer, and said capping silicon oxide layer;

depositing a interpoly oxide laminated layer overlying said semiconductor substrate and said DRAM word lines wherein said interpoly oxide laminated layer comprises a first layer, a second layer, and a third layer and wherein said first layer, said second layer, and said third layer are not planarized after said depositing;

etching a contact hole through said interpoly oxide laminated layer to the surface of said semiconductor substrate adjacent to said DRAM word lines;

depositing a polysilicon layer overlying said interpoly oxide laminated layer and completely filling said contact hole;

polishing away said polysilicon layer to define only polysilicon layer remaining in said contact hole and thereby also polishing said interpoly oxide laminated layer sufficiently to flatten the top surface of said interpoly oxide laminated layer; and completing said fabrication of self-aligning contact with polysilicon plug for a DRAM cell.

14. The method according to claim 13 wherein said first layer comprises HUSG having a thickness of between about 500 Angstroms and 1,500 Angstroms, said second layer comprises $O_3$-TEOS having a thickness of between about 2,000 Angstroms and 5,000 Angstroms and said third layer comprises PE-TEOS having a thickness of between about 4,000 Angstroms and 7,000 Angstroms.

15. The method according to claim 13 wherein said polysilicon layer is comprised of more than one layer of material.

16. The method according to claim 13 wherein said polysilicon layer comprises:

a first layer of high temperature doped polysilicon film having a thickness of between about 300 Angstroms and 1,000 Angstroms; and a second layer of doped polysilicon having a thickness of between about 3,000 Angstroms and 5,000 Angstroms.

17. The method according to claim 13 wherein said polishing away of said polysilicon layer and said interpoly oxide laminated layer is by chemical mechanical polishing.

* * * * *